US011916350B2

(12) United States Patent
Olson et al.

(10) Patent No.: US 11,916,350 B2
(45) Date of Patent: Feb. 27, 2024

(54) MULTI-QUANTUM-REFERENCE LASER FREQUENCY STABILIZATION

(71) Applicant: ColdQuanta, Inc., Boulder, CO (US)

(72) Inventors: Judith Olson, Northglenn, CO (US); Gabriel Ycas, Boulder, CO (US)

(73) Assignee: ColdQuanta, Inc., Boulder, CO (US)

(*) Notice: Subject to any disclaimer, the term of this patent is extended or adjusted under 35 U.S.C. 154(b) by 0 days.

(21) Appl. No.: 18/137,385

(22) Filed: Apr. 20, 2023

(65) Prior Publication Data
US 2023/0344189 A1    Oct. 26, 2023

Related U.S. Application Data

(60) Provisional application No. 63/334,164, filed on Apr. 24, 2022, provisional application No. 63/334,161, filed on Apr. 24, 2022, provisional application No. 63/334,163, filed on Apr. 24, 2022.

(51) Int. Cl.
| | |
|---|---|
| *H01S 3/13* | (2006.01) |
| *G04F 5/14* | (2006.01) |
| *H03L 7/26* | (2006.01) |
| *H01S 5/0687* | (2006.01) |
| *H01S 3/094* | (2006.01) |

(52) U.S. Cl.
CPC .............. *H01S 3/1303* (2013.01); *G04F 5/14* (2013.01); *H01S 3/094076* (2013.01); *H01S 3/1305* (2013.01); *H01S 5/0687* (2013.01); *H03L 7/26* (2013.01)

(58) Field of Classification Search
CPC ................. H01S 3/1303; H01S 3/1305; H01S 3/094076; H01S 5/0687; G20B 6/29395; G04F 5/14; H03L 7/26

USPC ..................... 372/32, 38.01, 38.02; 356/454
See application file for complete search history.

(56) References Cited

FOREIGN PATENT DOCUMENTS

| EP | 3034463 A1 * | 6/2016 | ............. B82Y 10/00 |
|---|---|---|---|
| WO | WO-9106141 A * | 5/1991 | ........... H01S 5/0687 |

OTHER PUBLICATIONS

NIST, Optical Frequency Combs, National Institute of Standards and Technology, U.S. Department of Commerce, downloaded Apr. 13, 2023, pp. 1-10.

* cited by examiner

*Primary Examiner* — Arnold M Kinkead
(74) *Attorney, Agent, or Firm* — Van Pelt, Yi & James LLP; Clifton Leon Anderson

(57) ABSTRACT

A multi-quantum-reference (MQR) laser frequency stabilization system includes a laser system, an MQR system, and a controller. The laser system provides an output beam with an output frequency, and plural feedback beams with respective feedback frequencies. The feedback beams are directed to the MQR system which includes plural references, each including a respective population of quantum particles, e.g., rubidium 87 atoms, with respective resonant frequencies for respective quantum transitions. The degree to which the feedback frequencies match or deviate from the resonance frequencies can be tracked using fluorescence or other electro-magnetic radiation output from the references. The controller can stabilize the laser system output frequency based on plural reference outputs to achieve both short-term and long-term stability, e.g., in the context of an atomic clock.

19 Claims, 8 Drawing Sheets

MULTI-QUANTUM-REFERENCE LASER FREQUENCY STABILIZATION

CROSS REFERENCE TO OTHER APPLICATIONS

This application claims priority to U.S. Provisional Patent Application No. 63/334,164 entitled VACUUM SHROUD FOR REDUCED GAS PERMEATION RATES filed Apr. 24, 2022, U.S. Provisional Patent Application No. 63/334,161 entitled ATOMIC CLOCK WITH PLURAL OPTICAL ATOMIC REFERENCES UTILIZING A SHARED LASER LOCAL OSCILLATOR filed Apr. 24, 2022, and U.S. Provisional Patent Application No. 63/334,163 entitled FOUR-WALLED HELICAL OPTICAL PATH LENGTH IN VACUUM WITH PREDICTABLE POLARIZATION filed Apr. 24, 2022, all of which are incorporated herein by reference for all purposes.

BACKGROUND

Atomic clocks are used as time standards as cumulative errors can be less than a second over a billion years. With their extreme precision and accuracy, atomic clocks are poised to play an important role in a wide variety of fundamental research activities including relativistic and chronometric geodesy, the measurement of possible variations of fundamental constants, the search for dark matter in the universe, and the detection of gravitational waves. In more commercial arenas, atomic clocks provide for high-speed communications systems and the Global Positioning System (GPS).

In many atomic clocks, the interaction of atoms with the probing field perturbs the atomic energy levels and induces a systematic frequency shift of the clock transition that limits the ultimate clock frequency stability and accuracy. These limitations are of major concern in several types of atomic clocks, including compact microwave atomic clocks based on coherent population trapping (CPT), as well as optical clocks based on the probing of ultra-narrow quadrupole, octupole, and two-photon transitions or direct frequency-comb spectroscopy.

BRIEF DESCRIPTION OF THE DRAWINGS

Various embodiments of the invention are disclosed in the following detailed description and the accompanying drawings.

DETAILED DESCRIPTION

The present invention provides a laser stabilization system using feedback from plural quantum references to stabilize laser output frequency. Plural quantum references provide respective detection signals. In some embodiments, laser frequencies are adjusted based on the plural detection signals. In some embodiments, one or more detection signals can be used to adjust a quantum reference. Such a laser stabilization has particular applicability in the context of an atomic clock.

Herein, a "reference" is a population of quantum particles used to detect deviations in the value of a parameter associated with an input from a set or other reference value defined with respect to the reference. Herein, a "quantum reference" is a reference in which the set value is associated with a change in quantum state of a quantum particle, e.g., a transition from a ground state to a particular excited state of a rubidium 87 atom. A "multi-quantum reference" ("MQR") can provide two or more distinct detections of such deviations concurrently. For example, a multi-quantum-reference system can include two or more mono-quantum-reference devices (e.g., vapor cells) or at least one multi-quantum-device, e.g., that uses different quantum-state transitions to detect deviations.

In the context of an optical atomic clock, a quantum reference with low long-term stability can be used with a reference with low short-term stability to provide high stability over the short term and the long term. For example, a primary reference may be operated in a regime where it has low long-term instability, and a secondary reference may be operated in a regime where it has low short-term instability. The primary reference can then be used to correct or steer the secondary reference, such that the combined system has low instability at both short and long timescales.

Figure 1:
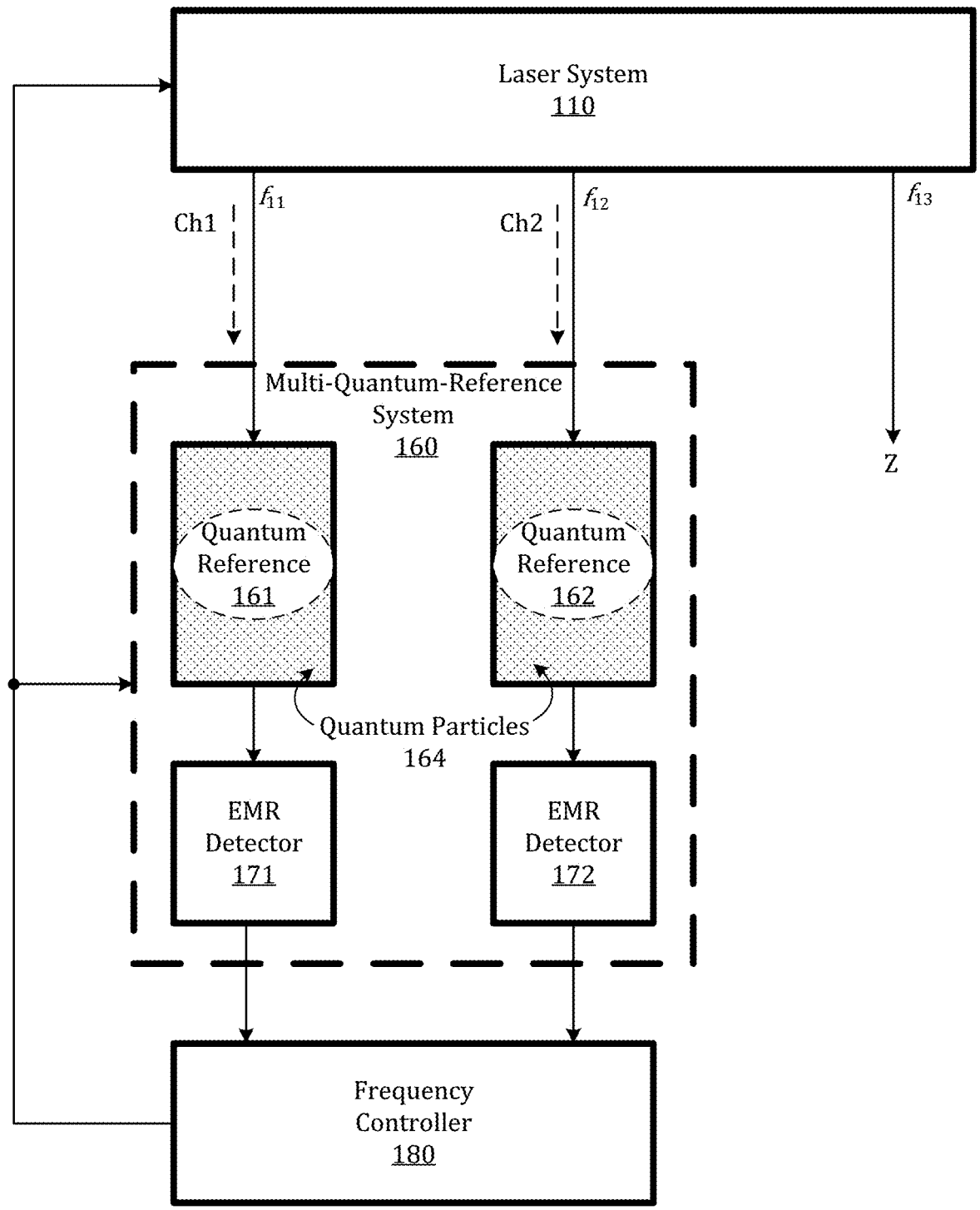
FIG. 1 is a schematic diagram of a laser stabilization system using plural quantum-references to stabilize its output frequency.

For example, a laser stabilization system 100, shown in FIG. 1, includes a laser system 110, an MQR system 160, and a frequency controller 180. Laser system 110 transmits a laser light of frequency $f_{11}$ along a channel Ch1 to a quantum reference 161 of multi-reference system 160, laser light of frequency $f_{12}$ along a channel Ch2 to a quantum reference 162 of multi-reference system 160, and laser light of frequency $f_{13}$, which is to serve as the stabilized output Z of laser stabilization system 100. Frequencies $f_{11}$, $f_{12}$, and $f_{13}$ can be the same, or one can differ from the other two or all three can differ from each other, depending on the embodiment.

Each quantum reference 161, 162 contains quantum particles 164 that respond to light of a resonant frequency by changing quantum state. Quantum particles 164 can include, for example, rubidium 87 ($^{87}$Rb) atoms, other isotopes of rubidium, other alkali-metal atoms, alkaline earth-metal atoms, other atoms, polyatomic molecules, and/or other molecular entities. (Herein, "molecular entity" is defined as "any constitutionally or isotopically distinct atom, molecule, ion, ion pair, radical, radical ion, complex, conformer, etc., identifiable as a separately distinguishable entity". This is the definition provided in The *Compendium of Chemical*

Terminology (first edition, known as the "Gold book".) For each quantum reference, the contained quantum particles may all be the same (e.g., only $^{87}$Rb atoms) or a mixture of quantum particle types (e.g., $^{87}$Rb atoms and $^{85}$Rb atoms). The contents of the quantum references 161 and 162 can be the same or different, depending on the embodiment.

Each quantum reference 161, 162 can output electromagnetic radiation (EMR) with an intensity that varies with the number of transitions resulting from absorption of incoming photons by the quantum particles. ("EMR" encompasses both optical frequencies and radio frequencies (RF)). Depending on the embodiment, a quantum reference output can include light of an incoming frequency $f_{11}$, $f_{12}$, that remains after some light is absorbed by the quantum particles, or fluorescence or other EMR emitted by the quantum particles in response to absorbing incident light. The amplitudes of these reference outputs can indicate how far the incoming light is from resonance with a quantum transition of the quantum particles and thus indicate deviations from a target frequency. The reference outputs can be captured by photo detectors or other EMR detectors 171 and 172, which output detection signals representing deviations from target frequencies for laser system outputs. Frequency controller 180 can then determine frequency adjustments based on the detector outputs.

Figure 2:
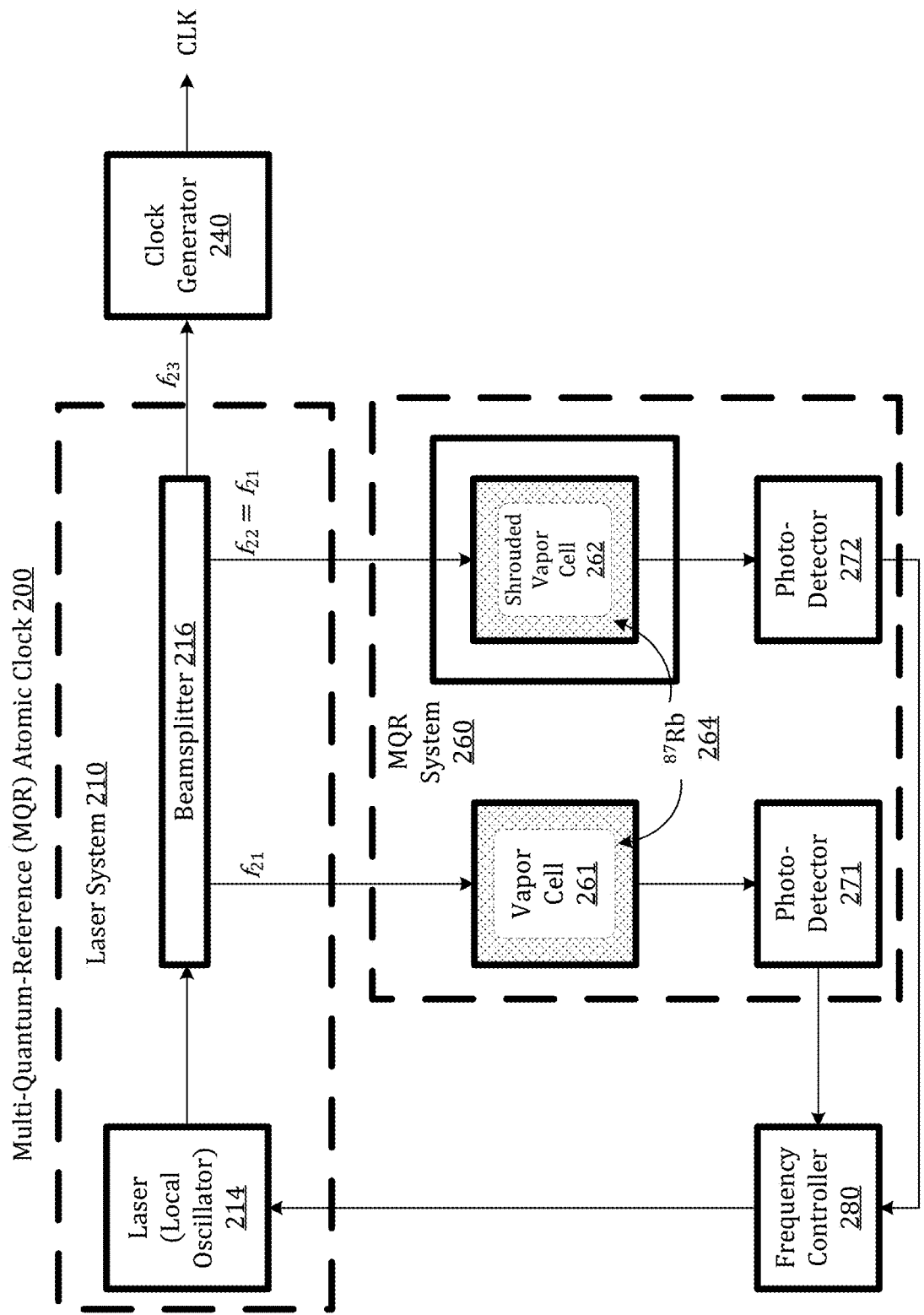
FIG. 2 is a schematic illustration of a multi-reference atomic clock with two detection systems the outputs of which are used to generate a combined frequency control signal used to stabilize a local oscillator.

An MQR atomic clock 200, shown in FIG. 2, includes a laser system 210, a clock generator 240, an MQR system 260, and a frequency controller 280. Laser system 210 includes a laser 214, serving as a local oscillator, and a beamsplitter 216. Beamsplitter 216 outputs plural beams having respective frequencies $f_{21}$, $f_{22}$, and $f_{23}$. In the illustrated variation, $f_{22}=f_{21}$, and there are sub-variations in which $f_{23}=f_{21}$ and in which $f_{23}\neq f_{21}$. In an alternative embodiment, $f_{22}\neq f_{21}$. Clock generator 240 converts the $f_{23}$ frequency optical beam to a time varying voltage electric clock signal CLK.

Laser light of frequency $f_{21}$ is directed to vapor cell 261 of MQR system 260. Vapor cell 261 is a glass cell filled with $^{87}$Rb atoms. When frequency $f_{21}$ is at or close to a resonance frequency for $^{87}$Rb, vapor cell 261 outputs fluorescence, the intensity of which correlates with how well frequency $f_{21}$ matches the transition frequency for $^{87}$Rb atoms. Photodetector 271 captures this fluorescence, and outputs an electric signal that represents the degree with which the received frequency $f_{21}$ matches the resonance frequency. Light of frequency $f_{22}$ is directed to shrouded vapor cell 262. Fluorescence output from shrouded vapor cell 262 is captured by photodetector 272, which outputs an electric signal representing the degree of match between frequency $f_{22}$ and the resonance frequency from the $^{87}$Rb atoms.

Figure 3:
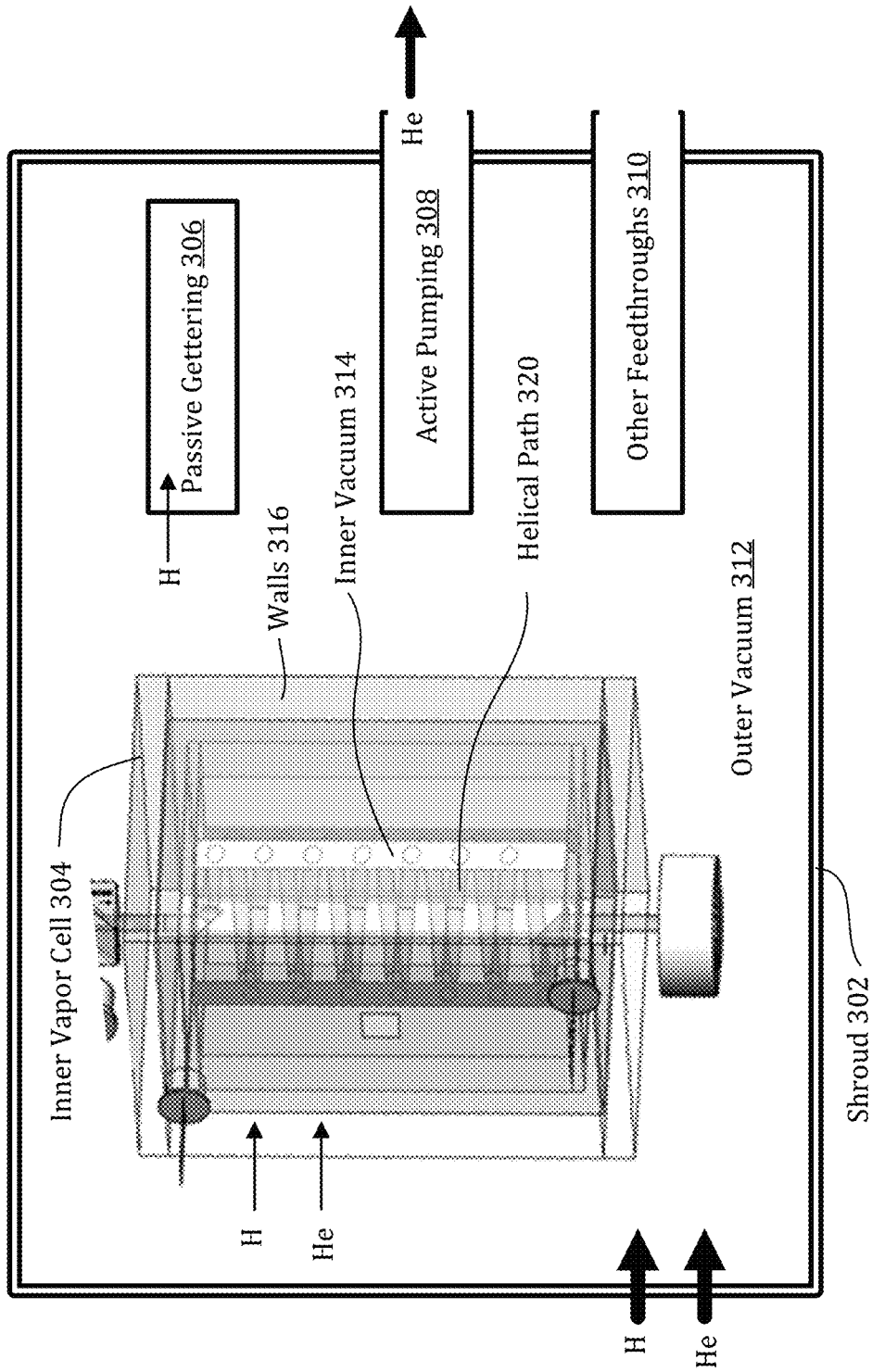
FIG. 3 is a schematic diagram of a shrouded vapor cell that serves as a reference device in the atomic clock of FIG. 2.

Shrouded vapor cell 262, shown in greater detail in FIG. 3, includes a shroud 302 enclosing an inner vapor cell 304, passive gettering 306, active pumping 308, and other feedthroughs 310. Shroud 302 encloses an outer vacuum 312 between itself and inner vapor cell 304. Inner vapor cell 304 encloses an inner ultra-high ($<10^{-9}$ Torr) vacuum 314. Gases including hydrogen (H) and helium (He) can diffuse through shroud 302 and inner vapor cell walls 316, impairing UHV 314 and thus the functionality of shrouded vapor cell 262. To minimize this impairment, shroud 302 is made of silica, which is relatively (e.g., compared to glass), but not completely, impermeable to hydrogen and helium. Active pumping 308 evacuates some of the He and other gases that might otherwise permeate into inner vacuum 314. In addition, passive gettering 306 can contribute to the removal of free hydrogen in outer vacuum 312.

Inner vapor cell 304, which is comparable to vapor cell 261 (FIG. 2), has walls 316 of borosilicate glass, which is more workable than the silica of shroud 302. Inner vapor cell 304 is arranged with respect to the $f_2$ output from beamsplitter 216 (FIG. 2) so that the incoming laser beam bounces off walls 316 and traces a roughly helical path 320 from top to bottom of inner vapor cell 304 before exiting cell 304 and shroud 302. Helical path 320 is longer than a path straight through inner vapor cell 304, giving the laser beam more opportunity to interact with rubidium atoms (or other quantum particles) in inner vapor cell 304. This increased interaction translates into a higher signal-to-noise ratio in the output of photodetector 272 (FIG. 2), which in turn results in more accurate control of the frequency output by laser 214. In an alternative embodiment, the path of a laser beam through a vapor cell is straight.

The outputs of photodetectors 271 and 272 (FIG. 2) are directed to frequency controller 280, which generates frequency control signals to adjust the frequency of laser 214 based on a combination of the photodetector outputs to compensate for short-term instability detected by photodetector 271 and the long-term drift detected by photodetector 272. Thus, MQR atomic clock 200 provides greater clock stability than could be achieved using either vapor cell 261 or shrouded vapor cell 262 alone.

In a variation of MQR atomic clock 200, frequency controller 280 controls the frequency of laser 214 directly based on the detection signal from photodetector 271. Frequency controller 280 also controls the frequency of laser 214 by controlling its temperature based on the detection signal from photodetector 272. Since temperature changes can control long-term frequency drift, drift can be reduced by regulating laser temperature. This is an example of using two detector outputs to control two laser parameters directly using two different detector outputs.

Figure 4:
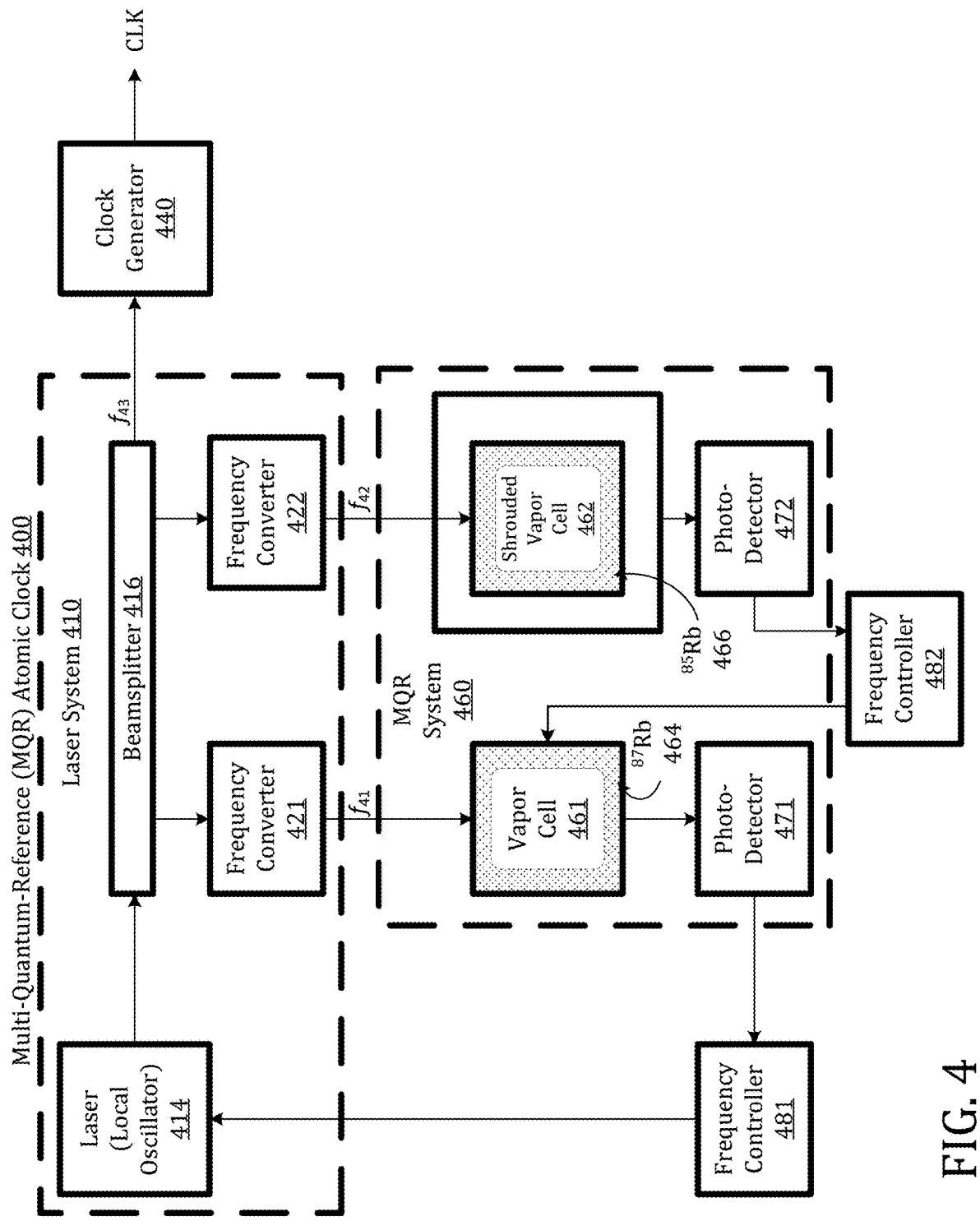
FIG. 4 is a schematic illustration of an atomic clock with two detection systems, a first of which is used to directly stabilize a local oscillator frequency and a second of which is used to regulate the first detection system.

An MQR atomic clock 400, shown in FIG. 4, includes a laser system 410, a clock generator 440, an MQR system 460, and frequency controllers 481 and 482. Laser system 410 differs from laser system 210 in that it includes frequency converters 421 and 422; in the illustrated variation, the output frequencies $f_{41}$ and $f_{42}$ of frequency converters 421 and 422 result in unequal frequencies; in another variation, they are equal. Like laser system 210 (FIG. 2), laser system 410 includes a laser 414 serving as a local oscillator and a beamsplitter 416. Frequency converter 421 converts one output of beamsplitter 416 to light of frequency $f_{41}$, while frequency converter 422 converts another output of beamsplitter 416 to light of frequency $f_{42}$. Beamsplitter 416 also outputs light of frequency $f_{43}$ from which clock generator 440 generates a clock output signal CLK.

MQR system 460, which is similar to multi-reference system 260 of FIG. 2, includes a vapor cell 461, a shrouded vapor cell 462, and photodetectors 471 and 472. Vapor cell 461 is populated with $^{87}$Rb atoms 464, while shrouded vapor cell 462 is populated with $^{85}$Rb atoms 466. Frequency control is split between frequency controllers 481 and 482, which are components of a distributed frequency controller. Frequency controller 481 directly controls the output frequency of laser 414 based on a detection signal from photo-detector 471. Frequency controller 482 controls the output frequency of laser 414 indirectly by controlling the temperature of vapor cell 461 so as to change the resonance frequency for the contained quantum particles.

Figure 5:
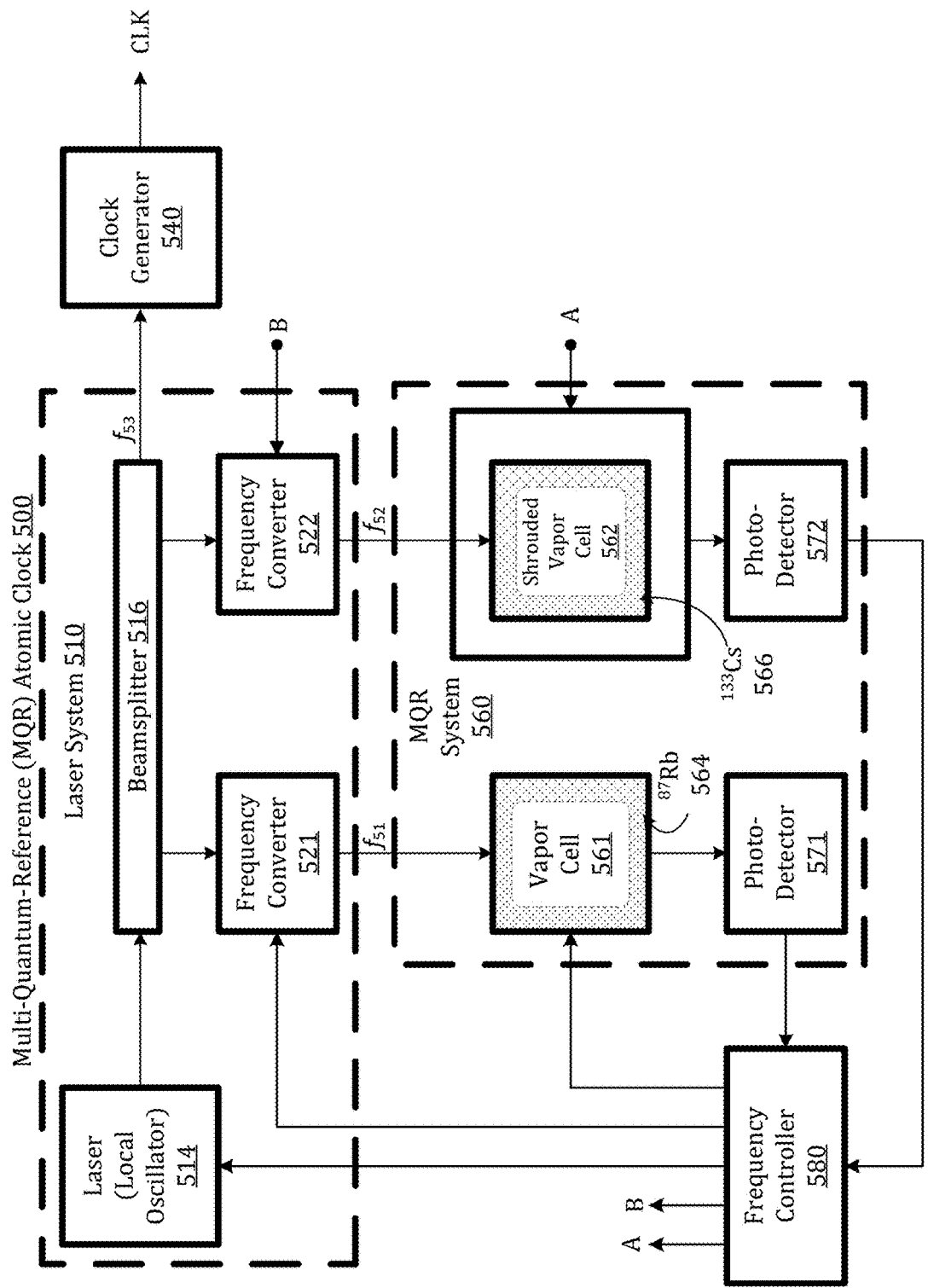
FIG. 5 is a schematic illustration of an atomic clock with a programmable frequency controller allowing laser and reference devices to be selected as components to be regulated to stabilize the atomic clock.

MQR atomic clock 500, shown in FIG. 5, includes a laser system 510, a clock generator 540, an MQR system 560, and a frequency controller 580. Laser system 510 includes a laser 514, a beam splitter 516, and frequency converters 521 and 522. MQR system 560 includes vapor cells 561 and 562 and photo detectors 571 and 572. Vapor cell 561 is populated by $^{87}$Rb atoms 564, while vapor cell 562 is populated by cesium 133 ($^{133}$Cs) atoms 566. Laser system 510 outputs frequencies $f_{51}$, $f_{52}$ and $f_{53}$. A programmable frequency controller 580 is coupled to laser 514, frequency converters 521 and 522, and vapor cells 561 and 562 so that it can control parameters of any or all these components, depending on programming, to stabilize the laser output frequency.

Figure 6:
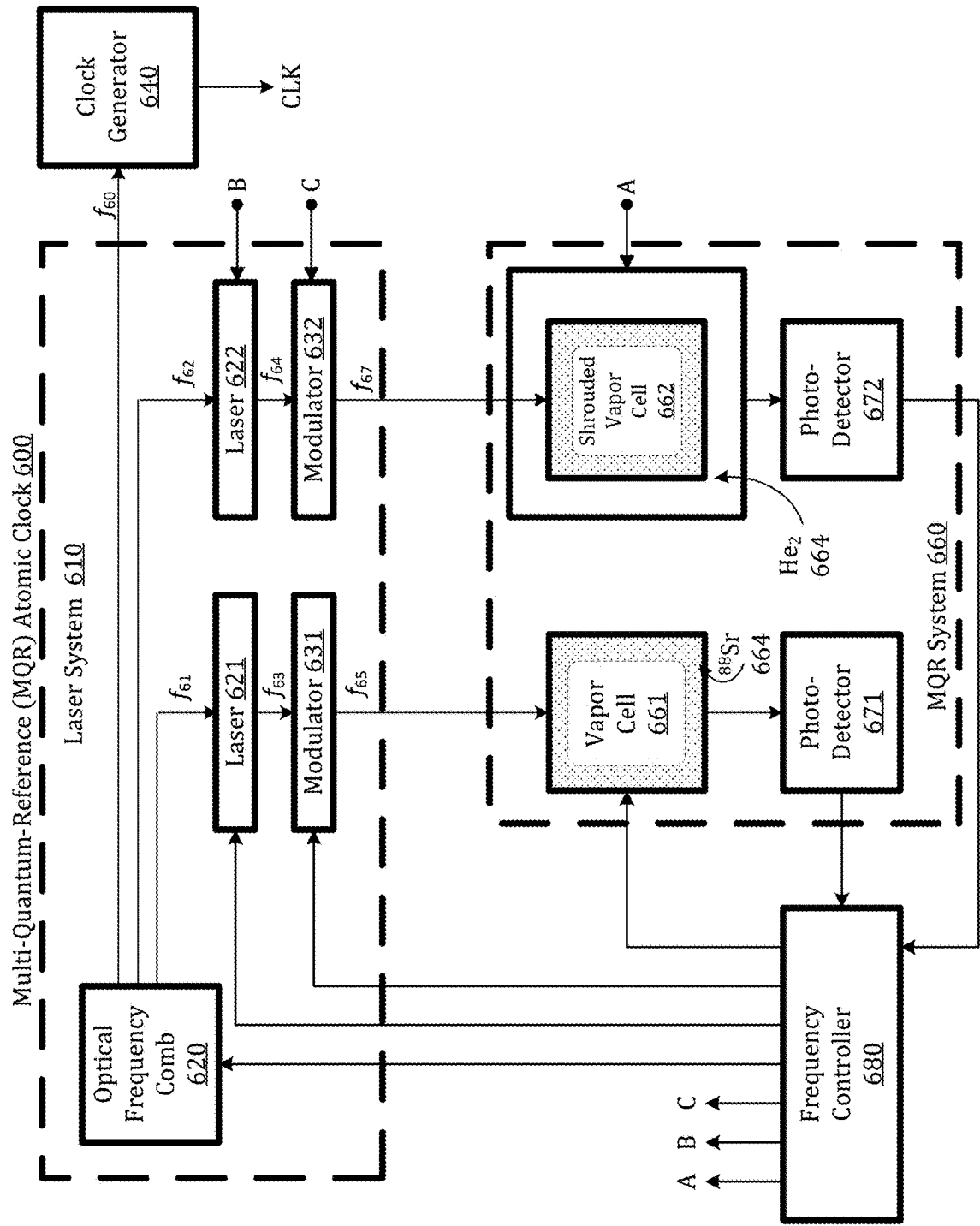
FIG. 6 is a schematic illustration of an atomic clock that uses an optical frequency comb as a local oscillator used to drive follower lasers, the outputs of which are directed to a multi-quantum-reference system.

An MQR atomic clock 600, shown in FIG. 6 includes a laser system 610, a clock generator 640, an MQR system 660, and a frequency controller 680. Laser system 610 includes a frequency comb 620, follower lasers 621 and 622, and modulators 631 and 632. Frequency comb 620 outputs beams of frequency $f_{60}$, $f_{61}$, and $f_{62}$. Frequency $f_{60}$ is input to clock generator 640, frequency $f_{61}$ is input to follower laser 621, and frequency $f_{62}$ is input to follower laser 622. Follower lasers 621 and 622 output frequencies $f_{63}$ and $f_{64}$, respectively. Modulators 631 and 632 can be used to convert respective input frequencies to frequencies $f_{65}$ and $f_{66}$ respectively. In addition, modulators 631 and 632 can apply radio-frequency modulation to the laser output signals as part of a frequency modulation spectroscopy scheme.

Clock generator 640 generates a clock signal based on an output of laser system 610. MQR system 660 includes vapor cells 661 and 662 and photodetectors 671 and 672, using these components to detect deviations of outputs of laser system 610 from quantum transition resonances of quantum particles contained by vapor cells 661 and 662. Vapor cell 661 is populated by strontium 88 ($^{88}$Sr) atoms 664, while vapor cell 662 is populated by dihelium (He$_2$) molecules 666. Programmable frequency controller 680 can be programmed to control the frequency input to clock generator 640 by controlling parameters of one or more of lasers 621 and 622, modulators 631 and 632, and vapor cells 661 and 662. In scenarios in which modulators 631 and 632 apply radio frequency modulation, frequency controller 680 can demodulate the photodetector outputs to determine the frequency adjustments to be implemented.

Figure 7:
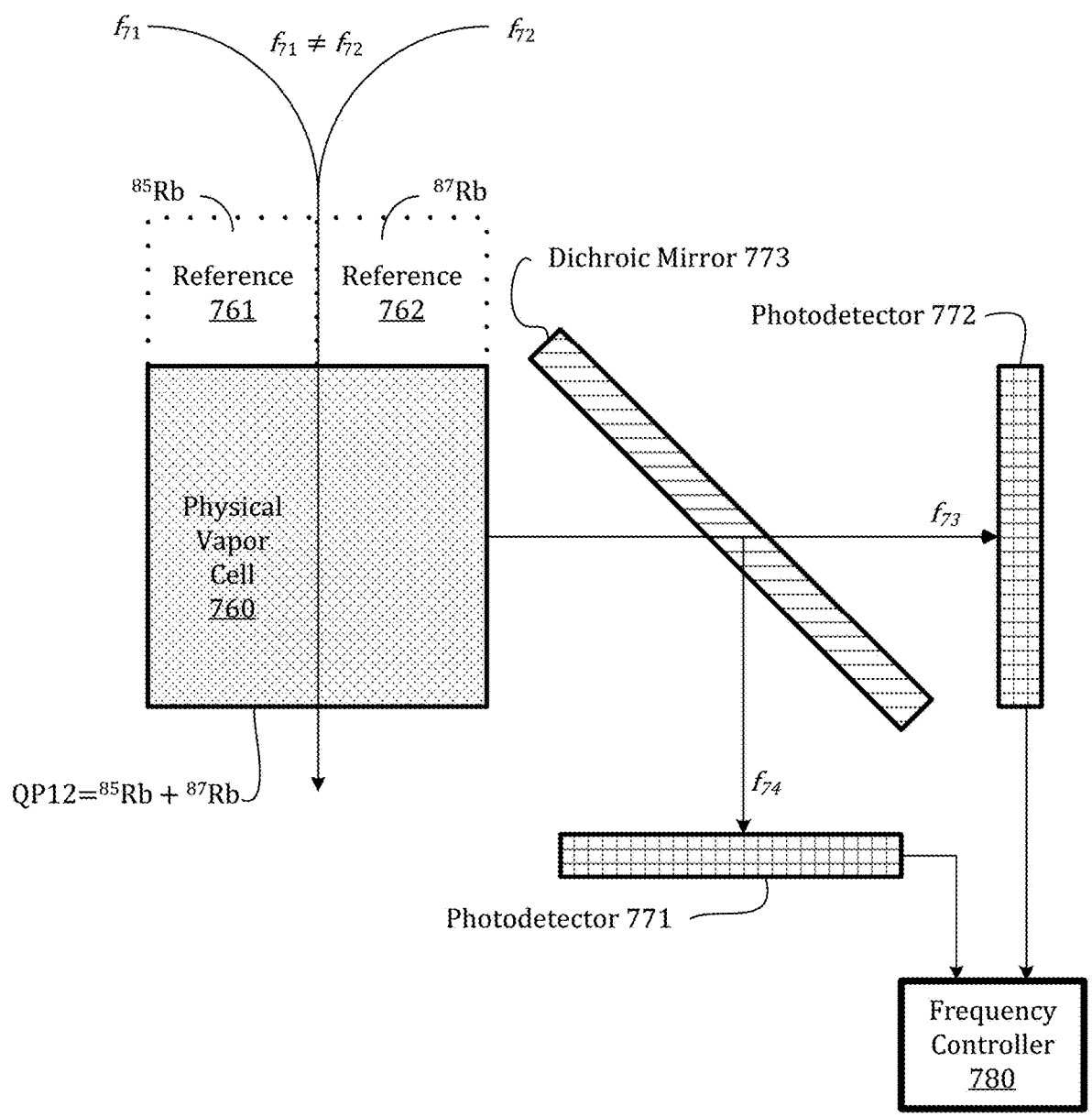
FIG. 7 is a schematic diagram of a vapor cell serving as a host for two references.

As shown in FIG. 7, the plural quantum references 761 and 762 (e.g., $^{85}$Rb and $^{87}$Rb respectively), can be hosted by common hardware, e.g., a vapor cell 760. Two feedback outputs with frequencies $f_{71}$ and $f_{72}$ are merged into a single physical channel, which can host two virtual channels, one carrying frequency $f_{71}$ and the other carrying frequency $f_{72}$. Physical vapor cell 760 is populated with a mixture QP12 of two different isotopes of rubidium: rubidium 85 ($^{85}$Rb) and $^{87}$Rb, which are characterized by different transition frequencies. Physical vapor cell 760 hosts references 761 and 762, with reference 761 being populated by $^{85}$Rb atoms, while reference 762 is populated by $^{87}$Rb atoms.

In response to excitation by frequency $f_{71}$, the $^{85}$Rb atoms emit fluorescence at frequency $f_{73}$. In response to excitation by frequency $f_{72}$, the $^{87}$Rb atoms emit fluorescence at frequency $f_{74}$. As these frequencies exit vapor cell 760, they are separated by dichroic mirror 773 so that fluorescence of frequency $f_{73}$ is detected by photodetector 771, while fluorescence of frequency $f_{74}$ is detected by photodetector 772. The detector outputs are converted to electrical signals and transferred to frequency controller 780, which makes system output frequency adjustments based on the photodetector outputs.

Figure 8:
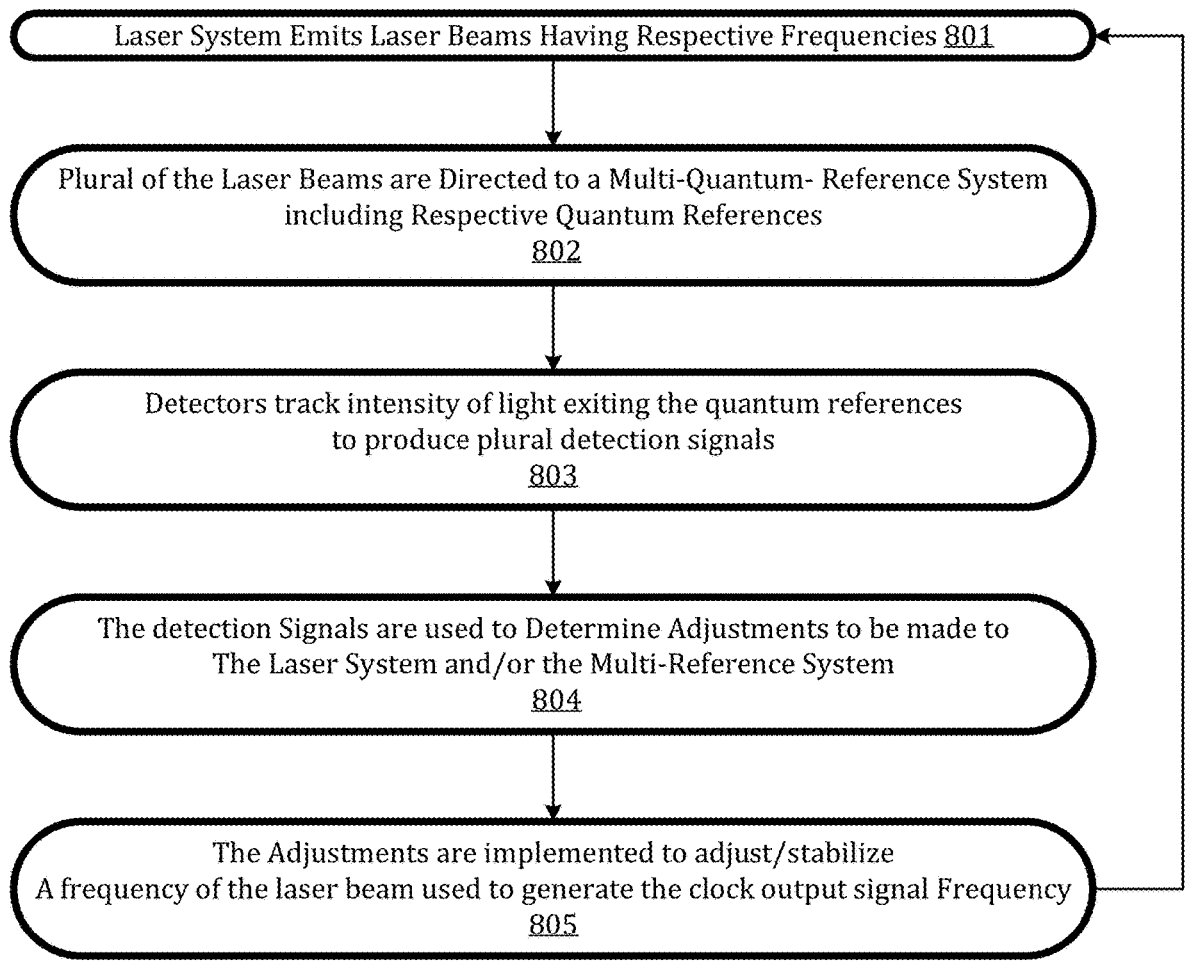
FIG. 8 is a flow chart of a process for regulating a local oscillator of an atomic clock using plural detection systems.

An MQR frequency stabilization process 800, flow charted in FIG. 8, begins, at 801, with a laser system emitting laser beams having respective frequencies. The laser system can include a laser or a frequency comb serving as a local oscillator. An embodiment using a frequency comb can include follower lasers. Other components can include pitch shifters such as acousto-optical modulators (AOMs) and electro-optical modulators (EOMs). The emitted laser beams can share a common frequency and/or can be characterized by different frequencies. In the context of an atomic clock, a clock signal can be generated based on at least one of the emitted laser beams.

At 802, plural of the emitted laser beams are directed (e.g., through free space or waveguides such as optical fibers) to a multi-quantum-reference (MQR) system. For example, two laser beams having the same or different frequencies can be directed to respective single-quantum reference devices or to a common MQR device that hosts plural references. Examples include: 1) directing laser beams of different frequencies to an MQR device; and 2) directing laser beams with the same or different frequencies along different paths through an MQR device.

At 803, for each reference, tracking light exiting the reference and indicative of an extent of light-particle interactions resulting in changes in quantum-states of the quantum particles. For example, the amount of laser light remaining as it exits a reference can indicate the amount of light absorbed by the quantum particles in a process for stimulated quantum transitions. Alternatively, fluorescence or phosphorescence or other emissions by the quantum particles as they decay from a quantum state reached due to interactions with the laser light can be tracked. The amount of quantum-state transitions serves as an indicator of the extent to which the laser light matches a respective resonance frequency of the quantum particles, and thus a deviation from the set frequency of the local oscillator.

At 804, adjustments designed to stabilize an output frequency, e.g., a frequency used in generating a clock signal, are determined based on the tracked light and indicative of deviations of laser light frequency from respective set values. The adjustments can include adjusting a frequency control for the local oscillator, adjusting parameters, e.g., temperature, pressure, that affect laser frequency, adjusting parameters of follower lasers and references that can ultimately affect laser system output frequencies. Actions 801-805 can be iterated continuously.

The present invention provides a laser local oscillator (LO) that is shared between multiple optical atomic frequency references. The local oscillator takes the form of a laser or frequency comb, to which other lasers are also disciplined, e.g., through frequency offset beat-note locking, a shared cavity lock, or a frequency comb stability transfer. The LO or ensemble of laser sources locked to the LO is then used to interrogate more than one atomic ensemble, e.g., two vapors, a vapor and a MOT, an optical lattice, and a single ion, etc. The atomic ensembles can be intentionally perturbed to optimize response to the shared LO ensemble, such as through temperature, vapor pressure, interrogation laser intensity, or applied auxiliary fields. The multiple atomic references' responses to the shared interrogative lasing ensemble are combined and used to generate a clock locking signal. Some references may be utilized to servo properties (e.g., laser intensity, atomic temperature) of auxiliary lasers or atomic systems in the reference ensemble rather than contribute to the clock frequency corrections directly.

An embodiment provides a four-walled helical optical path length in vacuum with predictable polarization. A quantum cell provides for long path-length optical interrogation of atoms or other molecular entities. The four-wall orientation with small helical pitch angle enables multiple high-reflectivity (HR) reflections with minimal and predictable contamination of the optical polarization as the beam propagates, enabling a useful optical interrogation method for applications including spectroscopy. This embodiment provides for interrogation of macroscopically disbursed atomic ensembles, e.g., vapors, lattices, beams, etc., which can benefit from maximal overlap between the ensemble and the interrogating laser.

Optical interrogation techniques for atoms are typically sensitive to the laser polarization during interaction, requiring optical paths through atomic ensembles to possess definite and well-defined polarization. The disclosed four-walled helical optical path with small pitch angle enables consistent and predictable optical polarization as the laser beam propagates provided a sufficiently large laser-beam waist is utilized. The helical optical path optics can be restrained to four planar surfaces, enabling ease of manufacture and minimizing the beam overlap upon reflection for precision spectroscopy applications or in the case of using counter-propagating beam interrogation techniques. Additional optics in or out of vacuum can be used to align the helical optical path to assist in light coupling in/out of the cell. Four HR coated surfaces on each of the walls repeatedly reflect the laser with a narrow pitch, resulting in near 45° angle of incidence. With precision machining and polishing of the cell walls, the beam polarization can support either consistent or alternating polarization schemes with each reflection, e.g., $\sigma^+\sigma^-$, $\pi^+\pi^-$, $\pi^+\pi^+$.

The illustrated embodiments provide a vacuum shroud for reduced gas permeation rates. A vacuum shroud is disposed around an inner cell that can be sensitive to gas-permeation rates; the inner cell contains atoms or other molecular entities resonant with incoming secondary beams and separates these molecular entities from a vacuum between the shroud and the inner cell. The vacuum between the shroud and the inner cell is maintained by passive and/or active pumping methods. The shroud's reduced pressure and background gas content compared to atmosphere reduce the rate at which gases, like hydrogen and helium, permeate into the inner cell. Gas permeation rates through glasses and other solid materials used for vacuum walls are dependent on the relative gas abundance and pressure between opposite sides of the wall. By replacing the typically atmosphere outer surface of a vacuum cell with a secondary layer of evacuated region between the cell and the shroud, the gas permeation rate is significantly reduced.

Some applications require pristine vacuum conditions that must be maintained for long periods of time and contain materials that react undesirably with passive gettering or active pumping modules. In these cases, traditional vacuum maintenance methods cannot be directly applied. This vacuum shroud approach enables a way for materials-sensitive UHV and XHV vacuum cells to be maintained indefinitely by instead pumping the region between the shroud and the inner cell.

In some embodiments, resonant transition frequencies match target feedback frequencies. For example, deviations from peak fluorescence of a reference output can be considered a deviation to be corrected. Other embodiments use alternative relations between a reference transition resonance frequency and a feedback frequency. For example, the target feedback frequency can be between transition resonance frequencies for first and second references. In such an embodiment, low fluorescence can be associated with an on-target feedback frequency, while a high intensity fluorescence from either reference can indicate a deviation from the target feedback frequency.

Herein, quantum particles are of the same "type" if they are identical in all particle-specific characteristics other than quantum state. In this definition, different isotopes of the same element are of different types.

Herein, a laser beam is electromagnetic radiation (EMR) emitted by a laser and extending along a defined path, whether that path is through free space or through an optical fiber or other waveguide. Herein, a beam-splitter is a device that converts an incoming laser beam into two or more out-going EMR beams, whether or not the device affects properties of the laser beam such as frequency, polarization, or phase, etc. or whether or not a carrier frequency is imposed on a beam.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the preceding description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Herein, all art labeled "prior art", if any, is admitted prior art; all art not labeled "prior art", if any, is not admitted prior art. The disclosed embodiments, variations thereupon and modifications thereto are within the scope of the present invention as defined by the following claims.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A laser frequency stabilization process comprising:
    generating, using an optical frequency comb as a source of plural laser frequencies, laser beams, the laser beams including an output beam having a system output frequency, a first feedback beam having a first feedback frequency, and a second feedback beam having a second feedback frequency;
    directing the first and second feedback beams respectively to first and second references to respectively yield first and second reference outputs, the first and second references respectively including quantum particles having respective quantum transition frequencies, the first and second reference outputs respectively representing a degree to which the first and second feedback frequencies match the quantum transition frequencies of the quantum particles respectively included by the first and second references, wherein the first reference has lower long-term stability than the second reference, and the second reference has lower short-term stability than the first reference; and stabilizing the system output frequency based on the first and second reference outputs.

2. The laser frequency stabilization process of claim 1 wherein the stabilizing includes controlling the system output frequency based on a combination of the first and second reference outputs.

3. The laser frequency stabilization process of claim 1 wherein the stabilizing includes adjusting a quantum transition frequency of at least one of the first and second references based on at least one of the first and second reference outputs.

4. A laser frequency stabilization process, comprising:
generating, by a laser system, laser beams, the laser beams including an output beam having a system output frequency, a first feedback beam having a first feedback frequency, and a second feedback beam having a second feedback frequency;
directing the first and second feedback beams respectively to first and second references to respectively yield first and second reference outputs, each reference including quantum particles having quantum transition frequencies, the first and second reference outputs respectively representing a degree to which the first and second feedback frequencies match the quantum transition frequencies of the quantum particles respectively included by the first and second references; and
stabilizing the system output frequency based on the first and second reference outputs, wherein a quantum transition frequency of the quantum particles included in the first reference is adjusted based on the second reference output.

5. A laser frequency stabilization process, comprising:
generating, by a laser system, laser beams, the laser beams including an output beam having a system output frequency, a first feedback beam having a first feedback frequency, and a second feedback beam having a second feedback frequency, wherein the first and second feedback frequencies are equal;
directing the first and second feedback beams respectively to first and second references to respectively yield first and second reference outputs, each reference including quantum particles having quantum transition frequencies, the first and second reference outputs respectively representing a degree to which the first and second feedback frequencies match the quantum transition frequencies of the quantum particles respectively included by the first and second references; and
stabilizing the system output frequency based on the first and second reference outputs.

6. A laser frequency stabilization process, wherein comprising:
generating, by a laser system, laser beams, the laser beams including an output beam having a system output frequency, a first feedback beam having a first feedback frequency, and a second feedback beam having a second feedback frequency, the laser system including a frequency comb and first and second follower lasers having respective first and second follower frequencies;
directing the first and second feedback beams respectively to first and second references to respectively yield first and second reference outputs, each reference including quantum particles having quantum transition frequencies, the first and second reference outputs respectively representing a degree to which the first and second feedback frequencies match the quantum transition frequencies of the quantum particles respectively included by the first and second references; and
stabilizing the system output frequency based on the first and second reference outputs, wherein a quantum transition frequency of the quantum particles included in the first reference is adjusted based on the second reference output.

7. The laser frequency stabilization process of claim 6 wherein the first follower frequency is the first feedback frequency.

8. The laser frequency stabilization process of claim 6 wherein the laser system includes a first frequency modulator for modulating the first follower frequency, an output of the first frequency modulator having the first feedback frequency.

9. The laser frequency stabilization process of claim 8 wherein at least one of the first follower laser and the first frequency modulator is controlled based on at least one of the first and second reference outputs so as to adjust the first follower frequency.

10. The laser frequency stabilization process of claim 1 wherein an atomic clock signal is based on at least one of first and second reference output frequencies of the first and second reference outputs.

11. A laser stabilization system comprising:
an optical frequency comb that provides a laser system output beam having a laser-system output frequency, and plural feedback beams having respective feedback frequencies, the plural feedback beams having a first feedback beam having a first feedback frequency, a second feedback beam having a second feedback frequency;
a reference system having plural quantum references, the plural quantum references including first and second quantum references, the first quantum reference including a population of quantum particles having a first transition frequency, a second quantum reference including a population of quantum particles having a second transition frequency, the first and second quantum references being optically coupled to the optical frequency comb for respectively receiving the first and second feedback beams, the first and second quantum references respectively outputting a first and second reference outputs in response to receiving the first and second feedback beams, the first and second reference outputs respectively indicating respective extents to which the respective feedback frequencies match the respective transition frequencies; and
a controller for stabilizing the laser-system output frequency based on both of the first and second reference outputs.

12. The laser stabilization system of claim 11 further comprising a clock generator for generating an atomic clock signal based on the laser-system output frequency.

13. The laser stabilization system of claim 11 wherein the first and second feedback frequencies are equal.

14. The laser stabilization system of claim 11 wherein the first and second feedback frequencies are unequal.

15. The laser stabilization system of claim 11 wherein the quantum particles include alkali metal atoms.

16. The laser stabilization system of claim 11 wherein the controller controls the first transition frequency based on the second reference output.

17. The laser stabilization system of claim 11 wherein the first and second quantum references include respective populations of quantum particles located in respective ones of respective different cells.

18. The laser stabilization system of claim 11 wherein the first and second quantum references include respective populations of different quantum-particle types co-located in a common cell.

19. The laser stabilization system of claim 11 wherein the first and second reference outputs are generated as a result of different quantum transitions for a given quantum particle type.

* * * * *